United States Patent [19]

Baars et al.

[11] Patent Number: 4,831,378
[45] Date of Patent: May 16, 1989

[54] ANALOG-TO-DIGITAL CONVERTING APPARATUS HAVING AN AUTOMATIC GAIN CONTROL CIRCUIT

[75] Inventors: Nicolaas J. Baars, Amaye Sur Orne Evrecy; Etienne Ducrot, Versailles, both of France

[73] Assignee: U.S. Philips Corporation, New York, N.Y.

[21] Appl. No.: 119,000

[22] Filed: Nov. 9, 1987

[30] Foreign Application Priority Data

Nov. 14, 1986 [FR] France ................................ 86 15854

[51] Int. Cl.$^4$ ............................................. H03M 1/18
[52] U.S. Cl. .................................... 341/139; 341/138; 341/155; 358/174; 358/179
[58] Field of Search .... 340/347 AD, 347 M, 347 CC; 364/571; 358/280, 284, 174, 179; 382/54; 341/138, 139, 155

[56] References Cited

U.S. PATENT DOCUMENTS

| | | | |
|---|---|---|---|
| 3,971,015 | 7/1976 | Hornak | 340/347 AD |
| 4,058,808 | 11/1977 | Malaviya | 340/347 AD |
| 4,078,233 | 3/1978 | Frye | 340/347 AD |
| 4,589,034 | 5/1986 | Yokomizo | 358/234 |

Primary Examiner—William M. Shoop, Jr.
Assistant Examiner—Brian Young
Attorney, Agent, or Firm—Edward W. Goodman

[57] ABSTRACT

An analog-to-digital converting apparatus includes an analog controllable gain amplifier ($A_1$) connected to an input of an analog-to-digital converter A/N. A gain control signal of the amplifier ($A_1$) is obtained from at least one comparator (D16, D240, D224) for making a binary comparison between an output level of the analog-to-digital converter (A/N) and at least one predetermined threshold, and circuitry (SEL2, $S_2$, $I_2$) for controlling with respect to time the gain of the amplifier ($A_1$) as a function of the result of the comparison.

7 Claims, 5 Drawing Sheets

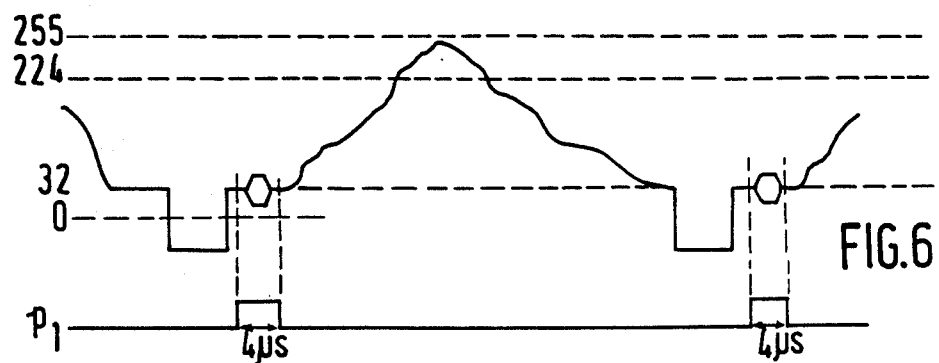
FIG.6
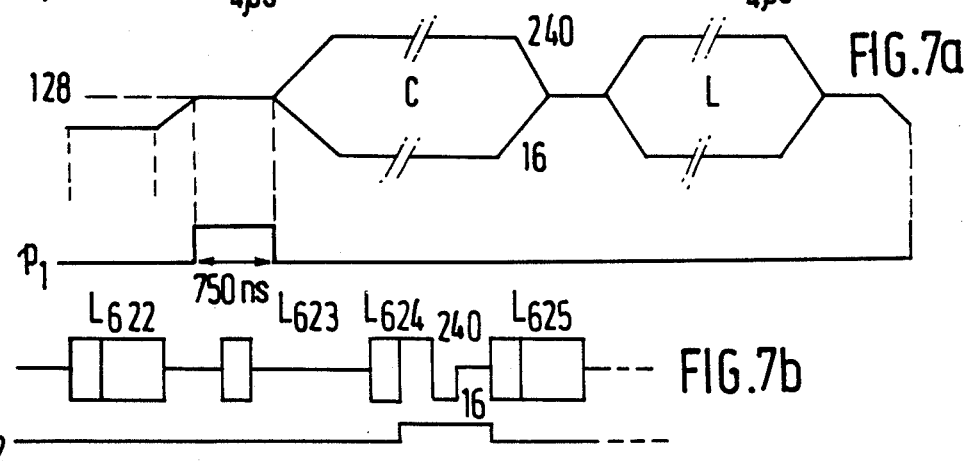
FIG.7a
FIG.7b
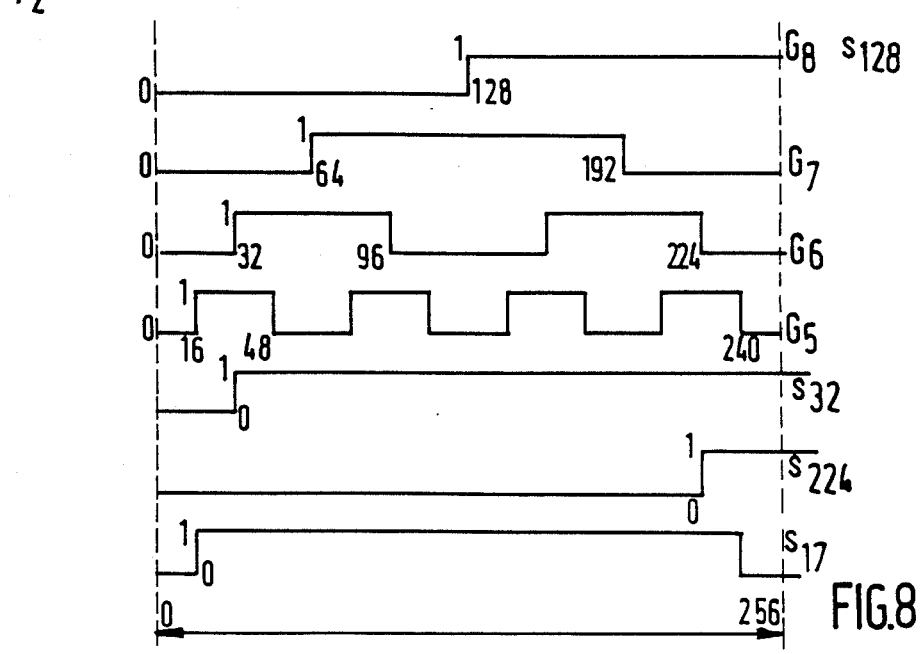
FIG.8

ANALOG-TO-DIGITAL CONVERTING APPARATUS HAVING AN AUTOMATIC GAIN CONTROL CIRCUIT

BACKGROUND OF THE INVENTION

The present invention relates to an analog-to-digital converting apparatus having an automatic gain control circuit comprising an analog gain controllable amplifier and an analog-to-digital (A/D) converter coupled to an output of the analog amplifier, a gain control loop of said analog amplifier receiving output signals from the A/D converter.

Such an analog-to-digital converting apparatus is known from the French Patent Application No. 2 536 620 (RCA Corp.), which corresponds to U.S. Pat. No. 4,517,586. Herein, the values of the digital samples from the A/D converter are digitally compared to a reference level, in order to produce a digital difference signal which is converted by a digital-to-analog converter into an analog gain control signal of the gain controllable amplifier. This solution leads to a complicated and thus costly circuitry.

SUMMARY OF THE INVENTION

The present invention has for its object to provide an analog-to-digital converting apparatus of the type stated before, in which no digital-to-analog converter is utilized for controlling the amplifier gain. Hence, the A/D converting apparatus is simplified and thus less costly.

To this end, the analog-to-digital converting apparatus according to the invention is characterized in that it comprises at least one comparator for making a binary comparison between an output level of the analog-to-digital converter and at least one given threshold, and means for controlling the amplifier gain in a time-controlled fashion as a function of a result of said comparison.

The above comparator comprises advantageously a decoder of a logic level corresponding to at least one white level of at least one television transmission system.

The means for controlling the amplifier gain in a time-controlled fashion can comprise a first controllable current source effecting the charging and discharging of a first capacitor, which is coupled to a gain control input of said amplifier.

The above first controllable current source can comprise a first differential stage having a first and a second transistor whose emitters are coupled to a first control current source, the collector of the first transistor being coupled to a supply voltage source and that of the second transistor to said first capacitor as well as a second control current source, the bases of the first and second transistors receiving a first differential signal corresponding to the result of said comparison, the first control current source having a current value distinctly superior to that of the second control current source, so that the first capacitor is charged with a given time constant across the second control current source for a first logic state of the first differential signal, and for a second logic state of the said signal, said first capacitor is discharged with a shorter time constant across the first control current source.

The A/D converting apparatus according to the invention can also comprise means for controlling, in a time-controlled fashion, a continuous level at a signal input of the amplifier as a function of the result of a comparison produced by a second decoder of a logic level, corresponding to a continuous level standardized by at least one television transmission system. Said means for controlling the continuous level in a time-controlled fashion can also comprise a second controllable current source effecting the charging and discharging of a second capacitor, which is coupled in series to the signal input of said amplifier.

In a preferred embodiment, the second controllable current source comprises a second differential stage having a third and a fourth transistor whose emitters are coupled to a third control current source, the collector of the third transistor being coupled to that of a fifth transistor whose emitter is coupled to said supply voltage source, the collector of the fourth transistor being coupled to said second capacitor as well as the collector of a sixth transistor whose emitter is coupled to said supply voltage source, the bases of the fifth and sixth transistors being intercoupled, and the base and the collector of the fifth transistor being coupled so that the fifth and sixth transistors form a current mirror circuit.

BRIEF DESCRIPTION OF THE DRAWINGS

The invention will be better understood when reading the description given hereinbelow as a non-limiting example, with reference to the following Figures, in which:

FIGS. 6, 7a and 7b show, respectively, PAL or SECAM luminance signals, a signal according to the MAC television transmission system, and a detail of a luminance signal of last lines of a picture according to the MAC television transmission system;

FIG. 8 shows logic stages of a GRAY encoding provided by outputs $G_1 \ldots G_8$ of the A/D converters;

DETAILED DESCRIPTION OF THE INVENTION

Figure 1:
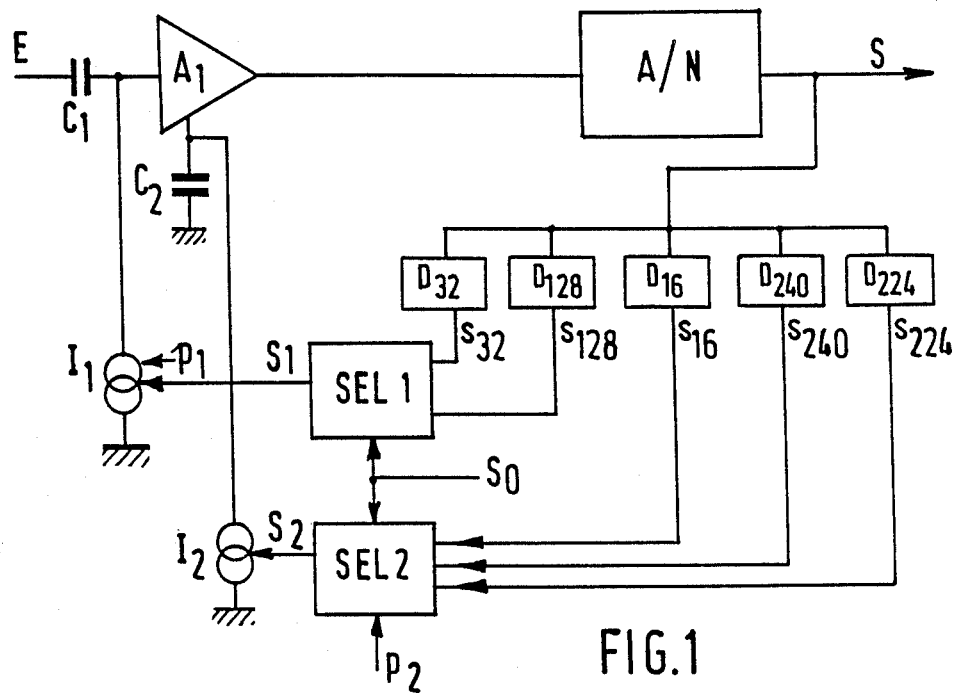
FIG. 1 shows a general diagram of an A/D converting apparatus according to the invention.

According to FIG. 1, a gain control input of an amplifier $A_1$ of the variable gain type is connected to one of two terminals of a capacitor $C_2$, whose other terminal is connected to ground.

The charging and discharging of the capacitor $C_2$ is obtained from a controllable current source $I_2$ which allows the realization of a counter reaction of automatic gain control. An output of the amplifier $A_1$ drives an analog-to-digital (A/D) converter A/N having outputs S which produce a digital signal whose level is to be controlled according to certain parameters, more specifically, in order to avoid saturation at the output of the A/D converter A/N. In this specific case, an analog-todigital converting apparatus is shown for a television receiver which can be used for the classical PAL and SECAM reception as well as for satellite reception according to the MAC television transmission system. Thereto, the signals S are applied to decoders $D_{16}$, $D_{240}$ and $D_{224}$ whose output signals $s_{16}$, $s_{240}$ (for the MAC television transmission system) and $s_{224}$ (PAL or SECAM) each have a logic 1 or 0 level depending on the condition of the output signals S of the A/D converter A/N. The signals $s_{16}$, $s_{240}$ and $s_{224}$ are applied to a selecting circuit SEL2, which receives a logic selecting signal $S_0$ indicating whether the receiver operates on a transmission according to the PAL or SECAM television transmission system, or a transmission according to the MAC television transmission system. The selecting circuit SEL2 also receives control pulses p2 of the automatic gain control.

The output signal $S_2$ of the selecting circuit SEL2 controls a controllable current source $I_2$ in one direction or the other with an intensity which can vary with the direction, in order to attain a time-controllable charging or discharging of the capacitor $C_2$, with time constants which may be different.

According to the invention, a correction of a continuous level can also be realized in an analog manner by controlling a time-controlled charging and discharging of a capacitor $C_1$ connected in series to a signal input of the amplifier $A_1$ with the aid of a controllable current source $I_1$.

While reference is always made to the preceding example, concerning a universal television receiver, the output signals S of the analog-to-digital converter A/N are applied to the inputs of the two decoders $D_{32}$ and $D_{128}$ producing at their outputs, the signals $s_{32}$ (PAL or SECAM) and $s_{128}$ (for the MAC standard) each having a logic 1 or 0 level depending on the value of the output signals S. The signals $s_{32}$ and $s_{128}$ are applied to a selecting circuit SEL1 receiving the logic selecting signal $S_0$ indicating whether the receiver operates according to a PAL or SECAM television transmission system or otherwise according to the MAC television transmission system. The controllable current source $I_1$ also receives control pulses p1 to correct the continuous level (see FIG. 6). Such a pulse is present in the PAL or SECAM television transmission system at the beginning of each line at the moment when the signal has reached a level equal to one-eighth of the maximum amplitude (32 for an 8-bit encoding). According to the MAC television transmission system, the signal p1 is a pulse 750 ns in length at the beginning of each line during which the signal has a level equal to one-half the maximum amplitude, which is 128 for 8-encoding (see FIG. 7a). The output signal $S_1$ of the selecting circuit SEL1 controls the current source $I_1$ in one direction or in the other in order to attain a time-controlled charging or discharging of the capacitor $C_1$.

Figure 2:
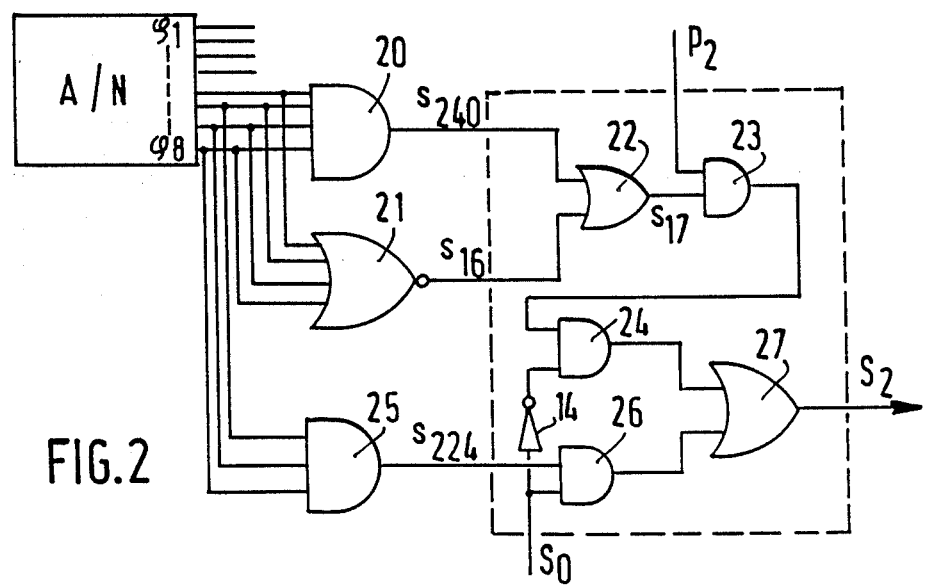
FIG. 2 shows a diagram of an embodiment of automatic gain correcting logic in universal television receivers.

With reference to FIG. 2, it will now be described in a more precise way how the automatic gain control signal $S_2$ is generated. According to the MAC television transmission system, the correction takes place when a signal occurs produced on the line 624 of each picture (see FIG. 7b), which is reversed to the white, black and grey reference signals. As the signal is symmetrical, automatic gain control is achieved controlling the white level as well as the black level. The black level is obtained when decoding the 16-value and the white level by decoding the 240 value. Owing to the symmetry of the reference signal of line 624 (MAC television transmission system), the automatic gain control is controlled by a signal $s_{16}$ which has, in the present case, the 1-value when the output of the analog-to-digital converter A/N has a value of $\leq 15$ and the 0-value if this is not the case, and by a signal $s_{240}$ which has the 1-value when the output of the A/D converter has a value of $\geq 240$ and 0 if this is not the case. The signal $s_{240}$ is an output signal of an AND gate 20, four inputs of which receive the four high-order bits from the output of the converter, that is to say $Q_5$, $Q_6$, $Q_7$ and $Q_8$, respectively. The signal $s_{16}$ is an output signal of an inverting OR gate 21, four inputs of which also receive the bits $Q_5$, $Q_6$, $Q_7$ and $Q_8$, respectively.

The signals $s_{16}$ and $s_{240}$ are applied to two inputs of an OR gate 22, an output signal of which forms a signal $s_{17}$ and drives one of the two inputs of an AND gate 23 whose other input receives the pulses p2 representative of the line 624 (see FIG. 7b). An output of the AND gate 23 is applied to an input of an AND gate 24, a further input of which receives the selecting signal $S_0$ inverted by an invertor 14.

According to the PAL or SECAM television transmission systems, the reference level for realizing the automatic gain control is the level 224 from the output of the A/D converter. In contradistinction to the MAC television transmission system, the automatic gain control is realized line by line. The signal $s_{224}$ is chosen so as to have a logic 1 level for an A/D converter output level $\geq 224$, and a logic 0 level if this is not the case. In order to achieve this, the three highest order bits $Q_6$, $Q_7$ and $Q_8$, respectively, are applied to three inputs of an AND gate 25, an output of which, supplying signal $s_{224}$, drives one of two inputs of an AND gate 26 whose other input receives the selecting signal $S_0$. Outputs of the AND gates 24 and 26 are applied to respective inputs of an OR gate 27, an output of which supplies the signal $S_2$.

Figure 3:
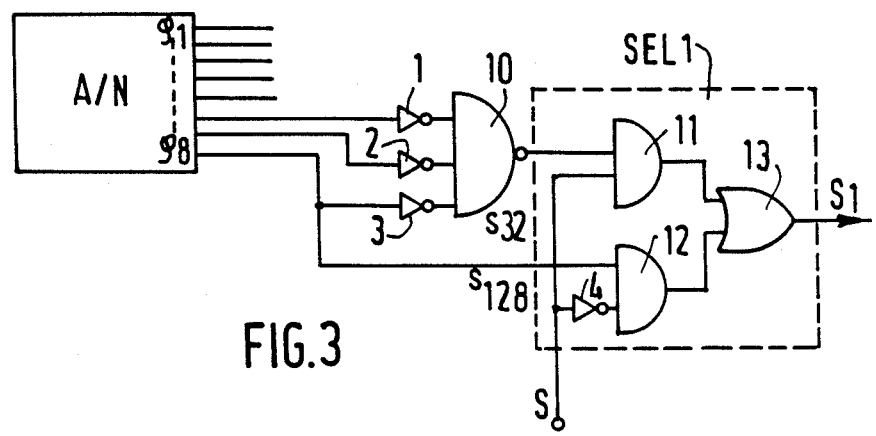
FIG. 3 shows a diagram of an embodiment of continuous level correcting logic in universal television receivers.

With reference to FIG. 3, it will now be described in a more precise manner how the continuous level correcting signal $S_1$ is generated. In the PAL or SECAM television transmission systems, the black background level corresponds to the 32 value at the output of the 8-bit analog-to-digital converter A/N. The 32 value is attained when one of the three first high order bits $Q_6$, $Q_7$, $Q_8$ has the value of 1. Consequently, the detection (decoder $D_{32}$) of the continuous reference background level is realized by connecting the outputs $Q_6$, $Q_7$ and $Q_8$ to inputs of the respective invertors 1, 2 and 3, outputs of which drive three inputs of an inverting AND gate 10. Thus, the output signal $s_{32}$ has the 0 level when $Q_6=Q_7=Q_8=0$ and the 1 level in all the other cases, that is to say, as soon as the black background level reaches the digital 32 value. In the MAC television transmission system, the correction of the continuous level is not effected on the black background level but on the grey level which corresponds to a value of 128 at the output of an 8-bit analog-to-digital converter. For the decoder (decoder $D_{128}$), it will be sufficient to take the high-order output $Q_8$ of the converter, producing directly the signal $s_{128}$. $s_{128}$ has the 1 level as soon as the grey level reaches the 128 value. The signal $S_{32}$ is applied to one of two inputs of an AND gate 11 whose other input receives a logic signal $S_0$, while $S_0$ has the logic 0 level when the reception takes place according to the MAC television transmission system and the logic 1 level for the PAL and SECAM television transmission systems. The signal $s_{128}$ is applied to one of two inputs of an AND gate 12, whose other input receives the logic signal $S_0$ reversed by an inverter 4. Outputs of the AND gates 11 and 12 are connected to inputs of an OR gate 13 delivering at an output the control signal $S_1$ for the current source $I_1$. When $S_0=0$ (MAC television transmission system) we have $S_1=s_{128}$; and $S_1=s_{32}$ when $S_0=1$ (PAL or SECAM television transmission systems). The authorization signal $p_1$ appears at the beginning of each line by way of a 750 ns pulse for the MAC television transmission system and a pulse of 4 microseconds in the PAL or SECAM television transmission systems and is utilized for authorizing the control of the current source $I_1$ as will be discussed hereinafter.

Figure 4:
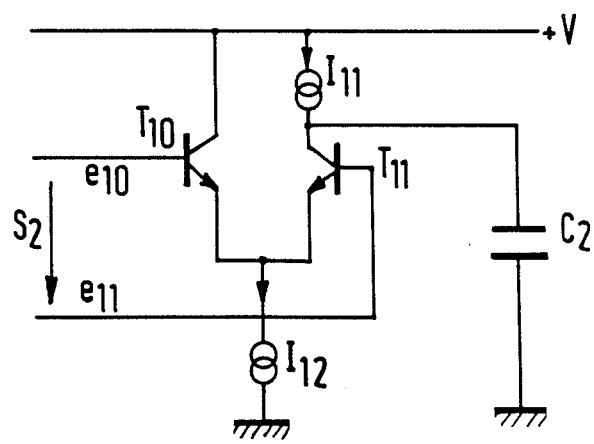
FIGS. 4 and 5 show embodiments of the controllable current sources corresponding to an automatic gain control and a continuous level correction, respectively.

FIG. 4 shows the operation of the automatic gain control from signal $S_2$ onwards. The signal $S_2$ is preferably a differential signal whose high level and low level are for example 200 mV apart, so as to drive the bases of transistors $T_{10}$ and $T_{11}$ constituting the inputs of a differential stage (signals $e_{10}$ and $e_{11}$). The emitters of transistors $T_{10}$ and $T_{11}$ are interconnected and connected to a current source $I_{12}$. The collector of transistor $T_{10}$ is directly connected to a positive supply voltage source $+V$, while that of the transistor $T_{11}$ is connected to a current source $I_{11}$. For example, when $S_2$ has a high level, the respective values of 2.2 V and 2 V can be obtained for $e_{10}$ and $e_{11}$ and vice versa for a low-level $S_2$. The current source values of $I_{11}$ and $I_{12}$ are chosen differently so as to obtain different time constants for charging and discharging the capacitor $C_2$.

A low value is chosen for the value of the current source $I_{11}$ in order to obtain a slow charging of the capacitor $C_2$, for example, with a time constant $t_1$ of a few seconds, and a value which is distinctly higher for the current source $I_{12}$ so as to obtain a rapid discharging of the capacitor $C_2$ while avoiding complete saturation, for example, with a time constant $t_2$ of 500 microseconds. By way of example, $I_{11}=100$ nA and $I_{12}=500$ $\mu$A are possible for a capacitor $C_2$ having a value of 0.47 $\mu$F.

When the signal $S_2$ has the logic 1 value, $e_{11}>e_{10}$, the transistor $T_{11}$ is conducting and the transistor $T_{10}$ is non-conducting. The capacitor $C_2$ is rapidly discharged owing to the current source $I_{12}$ because its current exceeds by far that of the current source $I_{11}$.

When the signal $S_2$ has the logic 0 level, $e_{10}>e_{11}$, the transistor $T_{10}$ is then in the conducting state and the transistor $T_{11}$ in the non-conducting state. The capacitor $C_2$ is slowly charged due to the low current value produced by the current source $I_{11}$.

It should be noted, by way of variant, that the differential stage constituted by the transistors $T_{10}$ and $T_{11}$ can be replaced by two differential stages in a cascade arrangement.

Figure 5:
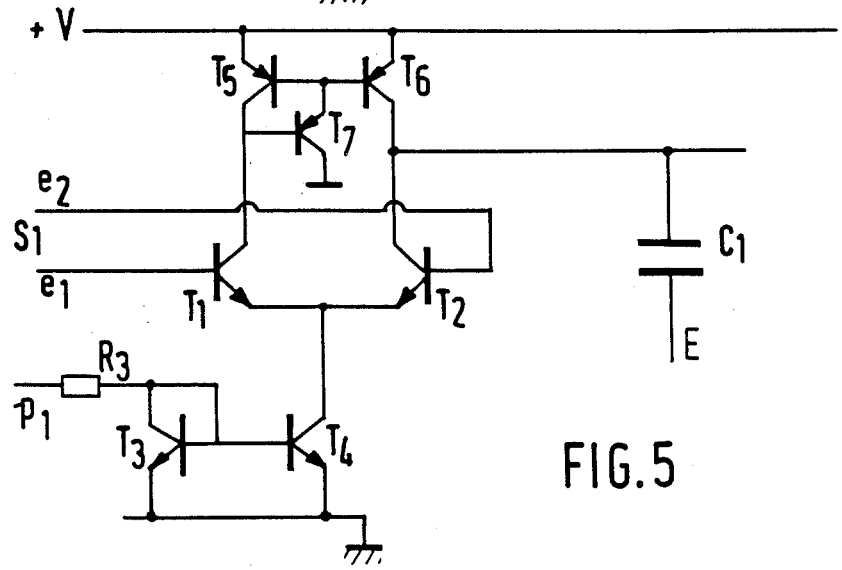

FIG. 5 shows how the signal $S_1$ is utilized for controlling the current source $I_1$. The signal $S_1$ is preferably a differential signal of which the high and low levels are 200 mV apart, for example, so as to drive the bases of the transistors $T_1$ and $T_2$ of a differential stage. For example, for the 1 level, the values of the signals $e_1$ and $e_2$ applied to the respective bases of the transistors $T_1$ and $T_2$ are 2.5 and 2.7 V, respectively, and 2.7 and 2.5 V, respectively, for the 0 level. The interconnected emitters of the transistors $T_1$ and $T_2$ are connected to the collector of a transistor $T_4$ whose emitter is connected to ground and whose base is connected to that of a transistor $T_3$, forming therewith a current mirror circuit, whose emitter is connected to ground, whose base and collector are interconnected and which receives pulse $p_1$ across a resistor $R_3$, so as to enable a correction of the continuous level only during a planned time interval.

Two transistors $T_5$ and $T_6$ are arranged in a current mirror circuit with the collectors of transistors $T_1$ and $T_2$. The emitters of these transistors $T_5$ and $T_6$ are connected to a supply voltage source $+V$ (for example 5 V), their bases are interconnected and their collectors are connected to those of transistors $T_1$ and $T_2$. Furthermore, the base and the collector of the transistor $T_5$ can be directly interconnected or also, as shown, through the emitter-base path of a transistor $T_7$ whose collector is connected to ground. If one of the two signals selected by $S_0$, $S_{32}$ or $s_{128}$, has the 1 level, then $e_2>e_1$, and the transistor $T_2$ is conducting while the transistor $T_1$ is non-conducting, and a discharging of the capacitor $C_1$ is achieved through transistor $T_4$ operating as the current source for the duration of the pulse $p_1$ which lowers a DC current level of the signal input of the amplifier $A_1$. In contradistinction thereto, if one of the two selected signals $s_{32}$ or $s_{128}$ has the 0 level, then $e_1>e_2$, and the transistor $T_1$ is conducting while the transistor $T_2$ is non-conducting. As the transistors $T_5$ and $T_6$ constitute a current mirror circuit, the capacitor $C_1$ is charged by the current of the same intensity as that passing through transistor $T_4$ and which passes through the transistor $T_6$ for the duration of the pulse $p_1$, which makes the DC current level at the signal input of the amplifier $A_1$ rise again.

FIG. 8 shows the logic levels of the four high order outputs in the GRAY code of the analog-to-digital converter. It will be remembered that the GRAY code is a code for which any incrementation by a positive or negative unit of a number only changes one of the bits. In this special case, the GRAY code is chosen for its property of simplifying the logic for the logic levels to be processed.

A $G_5$ bit has the 0 level for the logic values between 0 and 15, and changes to the 1 level for the 16 value. It changes again each time a multiple of 32 is added to the 16 value, the last change, a return to zero, taking place for the 240 value. A $G_6$ bit has the 0 level for the logic values between 0 and 31 and changes to the 1 level for the 32 value. It changes again each time a multiple of 64 is added to the 32 value, the last change, a return to zero, taking place for the 224 value. A $G_7$ bit has the 0 level for the logic values between 0 and 63 and changes to the 1 level for the 64 value and returns to the zero level for the values superior to 192. A $G_8$ bit has the 0 level for the logic values between 0 and 127, and to the 1 level for the logic values between 128 and 256.

The signal $s_{17}$ must have the 0 level for the values between 0 and 15 and 240 and 256, and the 1 level if this is not the case. The latter happens when $G_5=G_6=G_7=0$. The signal $s_{224}$ has the 0 level for the values between 0 and 223 and the 1 level for those comprised between 224 and 256. The latter happens when $G_6=G_7=0$ and $G_8=1$. The signal $s_{32}$ has the 0 level for the values comprised between 0 and 31 and the 1 level for those comprised between 32 and 256. The latter happens when $G_6=G_7=G_8=0$.

The signal $s_{128}$ finally corresponds directly to the logic output $G_8$.

Figure 9:
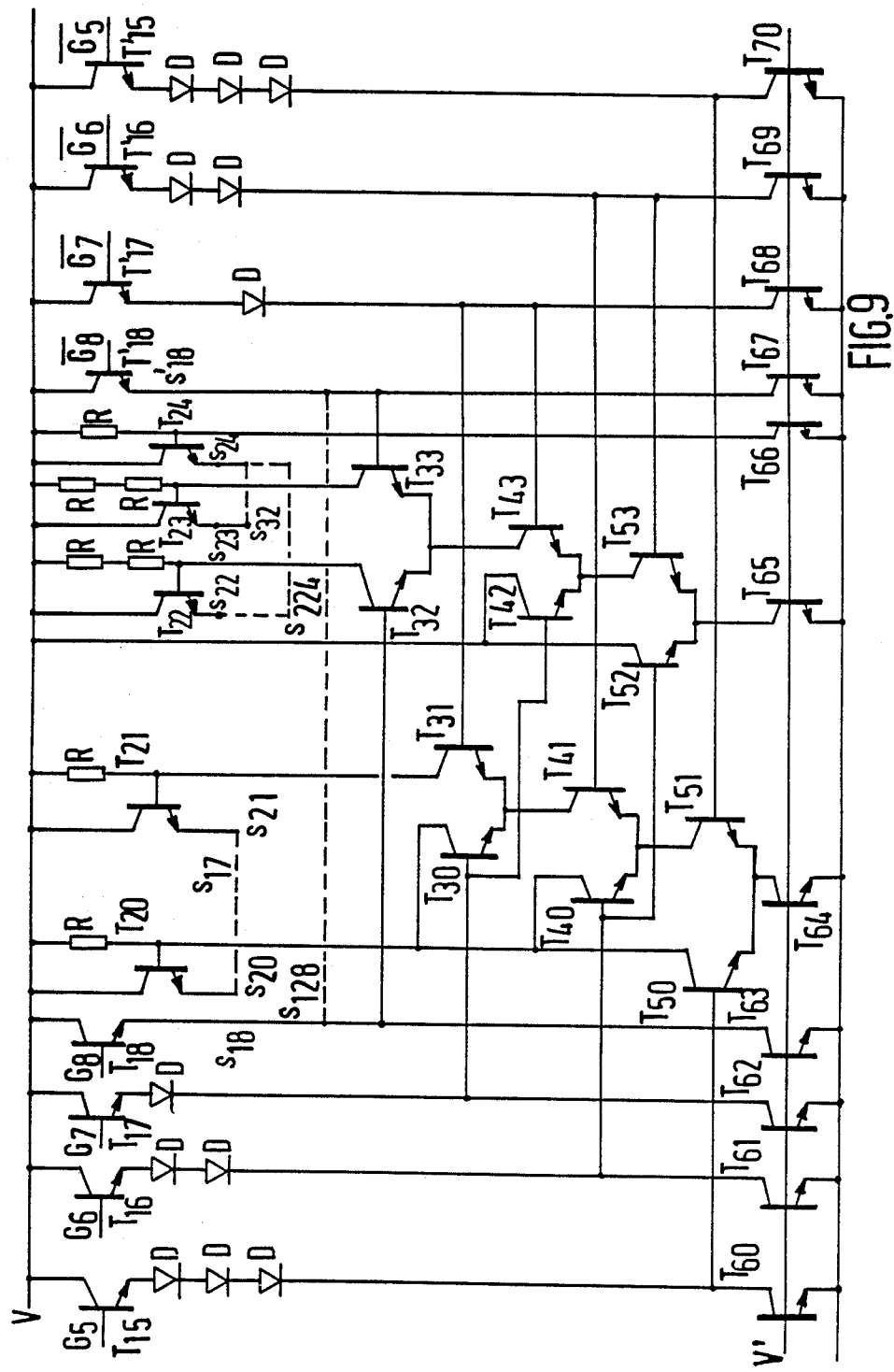
FIG. 9 shows a decoder operating on the basis of this code.

According to FIG. 9, the decoding of the stages discussed hereinbefore is realized from logic outputs $G_5$ to $G_8$ and their complements available in a logic TTL form. The general organization of the decoder consists in differential transmitter pairs coupled and spread out over three levels, with two differential pairs per level and switching current sources. The signals $G_5$, $G_6$, $G_7$ and $G_8$ are applied to the base of the respective transistors $T_{15}$, $T_{16}$, $T_{17}$, $T_{18}$, $T'_{15}$, $T'_{16}$, $T'_{17}$ and $T'_{18}$ whose collectors are connected to a supply voltage V, having the value of 5 V.

Eleven transistors $T_{60}$ to $T_{70}$ form eleven current sources and each receives on it base a same reference voltage V', and their emitters are connected to ground. The collectors of transistors $T_{60}$ and $T_{70}$ are connected to the emitters of respective transistors $T_{15}$ and $T'_{15}$ across three level shifting diodes arranged in series and in the forward direction. The collectors of transistors $T_{61}$ and $T_{69}$ are connected to the respective emitters of the transistors $T_{16}$ and $T'_{16}$ across two level shifting diodes arranged in series and in the forward direction. The collectors of the transistors $T_{62}$ and $T_{68}$ are connected to the respective emitters of the transistors $T_{17}$ and $T'_{17}$ across one level shifting diode arranged in the forward direction. The collectors of transistors $T_{63}$ and $T_{67}$ are connected directly to the emitters of the respective transistors $T_{18}$ and $T'_{18}$.

The two differential pairs of each level are constituted by emitter-coupled transistors $T_{30}$, $T_{31}$ and $T_{32}$, $T_{33}$ for the first level, $T_{40}$, $T_{41}$ and $T_{42}$, $T_{43}$ for the second level and $T_{50}$, $T_{51}$ and $T_{52}$, $T_{53}$ for the third level. The interconnected emitters of the transistors $T_{30}$ and $T_{31}$, $T_{32}$ and $T_{33}$, $T_{40}$ and $T_{41}$, $T_{42}$ and $T_{43}$, $T_{50}$ and $T_{51}$, and $T_{52}$ and $T_{53}$ are connected to the collectors of the respective transistors $T_{41}$, $T_{43}$, $T_{51}$, $T_{53}$, $T_{64}$ and $T_{65}$. The collectors of the transistors $T_{30}$, $T_{40}$ and $T_{50}$ are interconnected and connected to the base of a transistor $T_{20}$, which is further connected to the supply voltage V via a resistor R. The collector of the transistor $T_{20}$ is connected to the supply voltage V. The collector of the transistor $T_{31}$ is connected to the base of a transistor $T_{21}$, which is further connected to the supply voltage V via a resistor R. The collector of the transistor $T_{21}$ is connected to the supply voltage V. The collectors of the transistors $T_{32}$ and $T_{33}$ are connected to the bases of respective transistors $T_{22}$ and $T_{23}$, which are further connected to the supply voltage V via respective two resistors R. The collectors of the transistors $T_{42}$ and $T_{52}$ are connected to the supply voltage source V.

The collectors of the transistors $T_{60}$ to $T_{63}$ are connected to the bases of the respective transistors $T_{50}$; $T_{40}$ and $T_{52}$; $T_{30}$ and $T_{42}$; and finally $T_{32}$. The collectors of the transistors $T_{67}$ to $T_{70}$ are connected to the bases of the respective transistors $T_{33}$; $T_{31}$ and $T_{33}$; $T_{41}$ and $T_{53}$; and finally $T_{51}$. The base of a transistor $T_{24}$ is connected to the collector of transistor $T_{66}$ and to the supply voltage V via a resistor having the value of R, its collector also being connected to the supply voltage V.

The signal $s_{17}$ is available between the emitters of the transistors $T_{20}$ and $T_{21}$. This signal $s_{17}$ is a combination of two signals $s_{20}$ and $s_{21}$, available at these emitters. As a matter of fact, when $G_5=G_6=G_7=0$, the transistors $T_{31}$, $T_{41}$ and $T_{51}$ are conducting and the transistors $T_{30}$, $T_{40}$ and $T_{50}$ are non-conducting. The signal $s_{224}$ is available between the emitters of the transistors $T_{22}$ and $T_{24}$. This signal $s_{224}$ is a combination of two signals $s_{22}$ and $s_{24}$, available at these emitters. When $G_6=G_7=0$ and $G_8=1$, the transistors $T_{32}$, $T_{43}$ and $T_{53}$ are conducting.

The signal $s_{32}$ is available between the emitters of the transistors $T_{23}$ and $T_{24}$. This signal $s_{32}$ is a combination of two signals $s_{23}$ and $s_{24}$ available at these emitters.

When $G_6=G_7=G_8=0$, the transistors $T_{37}$, $T_{43}$ and $T_{53}$ are conducting.

Finally, the signal $s_{128}$ is directly available between the emitters of the transistors $T_{18}$ and $T'_{18}$. This signal $s_{128}$ is a combination of two signals $s_{18}$ and $s'_{18}$ available at the emitters of these transistors.

Figure 10:
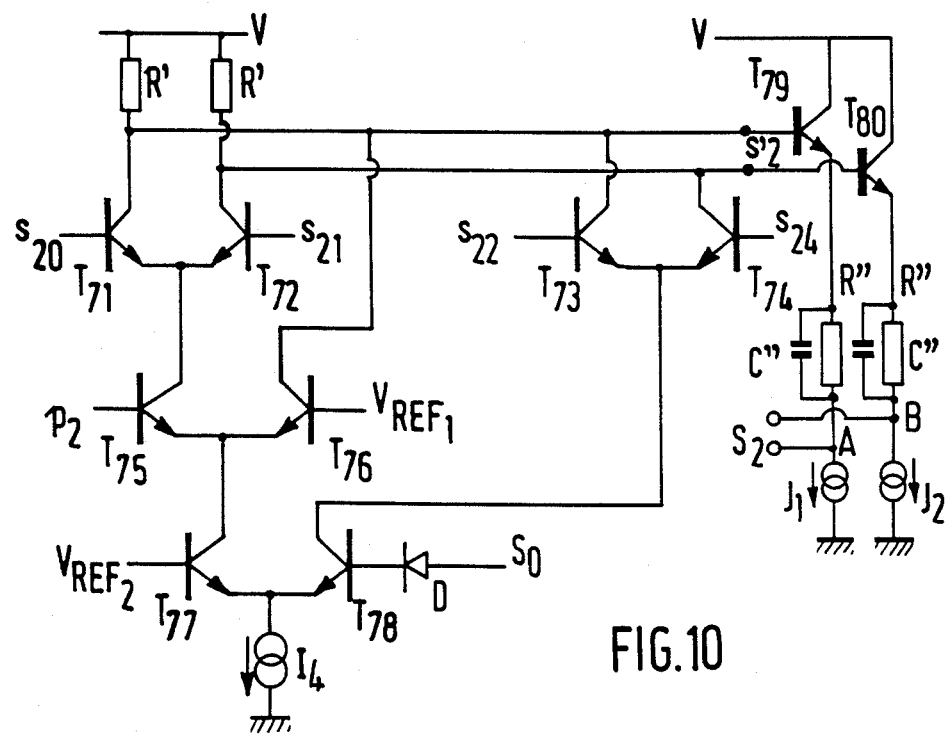
FIGS. 10 and 11 show an embodiment of a circuit producing signals $S_2$ and $S_1$ of the respective FIGS. 2 and 3 from outputs of the decoder of FIG. 9.

As shown in FIG. 10, an output signal $s'_2$ is obtained from the signals $s_{20}$, $s_{21}$, $s_{22}$, $s_{24}$, $p_2$ and $S_0$.

Two differential pairs, constituted by emitter-coupled transistors $T_{71}$ and $T_{72}$, $T_{73}$ and $T_{74}$, respectively, receiving on their bases the respective signals $s_{20}$, $s_{21}$, $s_{22}$ and $s_{24}$, form a control level. The collectors of the transistors $T_{71}$ and $T_{73}$ are interconnected and coupled to the supply voltage V via a resistor R'. Also, the collectors of the transistors $T_{72}$ and $T_{74}$ are interconnected and coupled to the supply voltage V via a resistor R'.

A first switching level is formed by a differential pair comprising two emitter-coupled transistors $T_{75}$ and $T_{76}$ receiving on their bases the signal $p_2$ and a reference voltage signal $V_{REF1}$, respectively. The collector of the transistor $T_{75}$ is connected to the coupled emitters of the transistors $T_{71}$ and $T_{72}$, while the collector of the transistor $T_{76}$ is connected to the interconnected collectors of the transistors $T_{71}$ and $T_{73}$.

A second switching level is formed by a differential pair comprising two emitter-coupled transistors $T_{77}$ and $T_{78}$ receiving on their respective bases a reference voltage signal $V_{REF2}$ and the signal $S_0$ level-shifted by a diode voltage.

The collectors of the transistors $T_{77}$ and $T_{78}$ are connected to the coupled emitters of the transistor $T_{75}$ and $T_{76}$, on the one hand, and $T_{73}$ and $T_{74}$, on the other hand, respectively. A current source $I_4$ referenced to earth is connected to the coupled emitters of the transistors $T_{77}$ and $T_{78}$.

When $S_0$ has a high level (operation according to the PAL or SECAM television transmission system); the transistor $T_{78}$ is conducting and the output signal $s'_2$ corresponds to the logic state of the signal $s_{224}$ (signals $s_{22}$ and $s_{24}$). When $S_0$ has a low level, the transistor $T_{77}$ is conducting and the output signal $s'_2$ corresponds to the logic state of the signal $s_{17}$ (signal $s_{20}$ and $s_{22}$). When the signal $p_2$ has the 1 level, the transistor $T_{75}$ is conducting. When the signal $p_2$ has the 0 level, the transistor $T_{76}$ is conducting and the collector of the transmitter $T_{71}$ retains the low level whatever logic state the inputs $s_{20}$ and $s_{21}$ have, and the signal $s'_2$ is kept at the 0 level, producing a slow charging of the capacitor $C_2$ by the current source $I_{11}$ (FIG. 4).

To obtain the signal $S_2$, from the signal $s'_2$ the signals present at the collectors of the transistors $T_{71}$ and $T_{72}$ are applied to the bases of respective transistors $T_{79}$ and $T_{80}$ inserted as emitter-followers, whose collectors are connected to the voltage source V, and whose emitters are coupled to ground via resistors R'', to whose terminals are connected capacitors C'' in parallel and respective current sources $J_1$ and $J_2$, the points A and B denoting the terminals common to the resistors R'' and the current source $J_1$ and $J_2$, respectively.

In the couplings of collectors of the transistors $T_{71}$ and $T_{72}$ to the supply voltage V, resistors R' are used for adjusting the differential voltage of $S_2$. For example, with $R'=1.6$ k$\Omega$ and $I_1=150$ $\mu$A, a differential voltage of 240 mV is obtained.

Assuming that $V_A$ and $V_B$ are the voltages at points A and B, $$V_A = V - V_{be} - R''J_1 - R'I_1k$$

$$V_B = V - V_{be} - R''J_2 - R'I_1(1-k)$$

in which $V_{be}$ denotes the base-emitter voltage drop of a transistor and k has the 0 or 1 value according to the switching direction of the differential pairs. When $V=5$ Volts, $R''=9.7$ kΩ, $J_1=J_2 100$ μA, $R'=1.6$ kΩ $I_1=150$ μA and $V_{be}=0.8$ V we obtain:

for $k=0$ $V_A=2.4648$ V $V_b=2.408$ V for $k=1$ $V_A=2.408$ V $V_b=2.648$ V.

Figure 11:
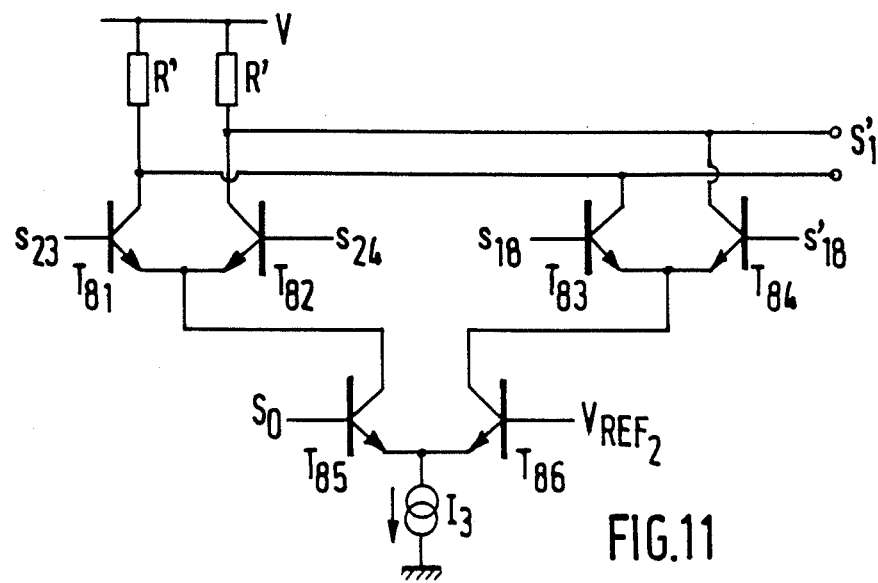

As shown in FIG. 11, the output signal $s'_1$ is obtained from the signals $s_{23}$, $s_{24}$, $s_{18}$, $s'_{18}$ and $S_0$.

Two differential pairs constituted by emitter-coupled transistors $T_{81}$ and $T_{82}$, $T_{83}$ and $T_{84}$, respectively, receiving on their bases the respective signals $s_{23}$ and $s_{24}$ (together $s_{32}$), on the one hand, and $s_{18}$ and $s'_{18}$ (together $s_{128}$), form a control level. The collectors of the transistors $T_{81}$ and $T_{82}$, on the one hand, and $T_{82}$ and $T_{84}$, on the other, are interconnected and coupled to the supply voltage V via resistors $R'$.

A switching level is constituted by a differential pair comprising two emitter-coupled transistors $T_{85}$ and $T_{86}$ receiving on their bases the respective signal $S_0$ and reference voltage signal $V_{REF2}$. The collector of transistor $T_{85}$ is connected to the interconnected emitters of the transistors $T_{81}$ and $T_{82}$, while the collector of the transistor $T_{86}$ is connected to the interconnected emitters of transistors $T_{83}$ and $T_{84}$. A current source $I_3$, which has a first terminal being connected to ground, has a second terminal connected to the interconnected emitters of the transistors $T_{85}$ and $T_{86}$. When $S_0$ has a high level (operation according to the PAL or SECAM television transmission system), the transistor $T_{85}$ is conducting and the output signal $S_i$ corresponds to the logic state of the signal $s_{32}$ (signals $s_{23}$ and $s_{24}$). When $S_0$ has a low level (operation according to the MAC standard), the transistor $T_{86}$ is conducting and the output signal $s_1$ corresponds to the logic state of the signal $s_{128}$ (signals $s_{18}$ and $s'_{18}$).

The signal $S_1$ can be obtained from the signal $S'_1$ in the same manner as the signal $S_2$ is obtained from the signal $S'_2$.

What is claimed is:

1. An analog-to-digital converting apparatus having an automatic gain control circuit comprising an analog gain controllable amplifier and an analog-to-digital (A/D) converter coupled to an output of said analog amplifier, a gain control loop of said analog amplifier receiving output signals from the A/D converter, characterized in that said analog-to-digital converting apparatus further comprises at least one comparator for making a binary comparison between an output level of the analog-to-digital converter and at least one predetermined threshold level, and means for controlling the amplifier gain with respect to time as a function of a result of said comparison, wherein the means for controlling the amplifier gain with respect to time comprises a first controllable current source for charging and discharging a first capacitor which is coupled to a gain control input of said amplifier.

2. An analog-to-digital converting apparatus as claimed in claim 1, characterized in that said first controllable current source has a first differential stage comprising a first and a second transistor whose emitters are coupled to a first control current source, a collector of the first transistor being coupled to a supply voltage source and a collector of the second transistor being coupled to said first capacitor as well as to a second control current source, bases of the first and second transistors receiving a first differential signal corresponding to the result of said comparison, the first control current source having a current value significantly higher than that of the second control current source, so that the first capacitor is charged with a first time constant through the second current source for a first logic state of the first differential signal and, for a second logic state of the first differential signal, the first capacitor is discharged with a second time constant shorter than said first time constant through the first current source.

3. An analog-to-digital converting apparatus having an automatic gain control circuit comprising an analog gain controllable amplifier and an analog-to-digital (A/D) converter coupled to an output of said analog amplifier, a gain control loop of said analog amplifier receiving output signals from the A/D converter, characterized in that said analog-to-digital converting apparatus further comprises at least one comparator for making a binary comparison between an output level of the analog-to-digital converter and at least one predetermined threshold level, and means for controlling the amplifier gain with respect to time as a function of a result of said comparison, wherein said analog-to-digital converting apparatus also comprises means for controlling, with respect to time, a continuous level at a signal input of the amplifier as a function of a result of a comparison produced by a second decoder of a logic level, corresponding to a continuous level standardized by at least one television transmission system.

4. An analog-to-digital converting apparatus as claimed in claim 3, characterized in that said means for controlling the continuous level with respect to time comprises a second controllable current source for charging and discharging a second capacitor which is coupled in series to the signal input of said amplifier.

5. An analog-to-digital converting apparatus as claimed in claim 4, characterized in that said second controllable current source has a second differential stage comprising a third and a fourth transistor whose emitters are coupled to a third control current source, a collector of the third transistor being coupled to a collector of a fifth transistor having a emitter coupled to said supply voltage source, a collector of the fourth transistor being coupled to said second capacitor as well as to a collector of a sixth transistor having an emitter coupled to said supply voltage source, bases of the fifth and sixth transistors being intercoupled, the base and the collector of the fifth transistor being coupled together so that the fifth and the sixth transistors form a current mirror circuit.

6. An analog-to-digital converting apparatus having an automatic gain control circuit comprising an analog gain controllable amplifier and an analog-to-digital (A/D) converter coupled to an output of said analog amplifier, a gain control loop of said analog amplifier receiving output signals from the A/D converter, characterized in that said analog-to-digital converting apparatus further comprises at least one comparator for making a binary comparison between an output level of the analog-to-digital converter and at least one predetermined threshold level, and means for controlling the amplifier gain with respect to time as a function of a result of said comparison, wherein said comparator comprises a first decoder of a logic level corresponding to at least one white level of at least one television transmission system, and wherein the means for controlling the amplifier gain with respect to time comprises a first controllable current source for charging and discharging a first capacitor which is coupled to a gain control input of said amplifier.

7. An analog-to-digital converting apparatus as claimed in claim 6, characterized in that said first controllable current source has a first differential stage comprising a first and a second transistor whose emitters are coupled to a first control current source, a collector of the first transistor being coupled to a supply voltage source and a collector of the second transistor being coupled to said first capacitor as well as to a second control current source, bases of the first and second transistors receiving a first differential signal corresponding to the result of said comparison, the first control current source having a current value significantly higher than that of the second control current source, so that the first capacitor is charged with a first time constant through the second current source for a first logic state of the first differential signal and, for a second logic state of the first differential signal, the first capacitor is discharged with a second time constant shorter than said first time constant through the first current source.

* * * * *